(12) United States Patent
Appadurai

(10) Patent No.: US 7,993,752 B2
(45) Date of Patent: Aug. 9, 2011

(54) TRANSPARENT CONDUCTIVE LAYER AND METHOD

(75) Inventor: Anna Selvan John Appadurai, Titusville, NJ (US)

(73) Assignee: Nano PV Technologies, Inc., Titusville, NJ (US)

( * ) Notice: Subject to any disclaimer, the term of this patent is extended or adjusted under 35 U.S.C. 154(b) by 577 days.

(21) Appl. No.: 12/077,272

(22) Filed: Mar. 17, 2008

(65) Prior Publication Data
US 2009/0229657 A1  Sep. 17, 2009

(51) Int. Cl.
*B32B 17/06* (2006.01)
(52) U.S. Cl. ........ 428/432; 428/428; 428/699; 428/701; 428/702
(58) Field of Classification Search .................. 428/428, 428/432, 699, 701, 702
See application file for complete search history.

(56) References Cited

U.S. PATENT DOCUMENTS

| | | | |
|---|---|---|---|
| 5,078,803 A | 1/1992 | Pier et al. | |
| 5,458,753 A * | 10/1995 | Sato et al. | 204/192.29 |
| 6,040,521 A * | 3/2000 | Kushiya et al. | 136/265 |
| 6,200,680 B1 | 3/2001 | Takeda et al. | |
| 6,261,694 B1 | 7/2001 | Iacovangelo | |
| 6,331,672 B1 | 12/2001 | Matsuda et al. | |
| 6,896,981 B2 | 5/2005 | Iwabuchi et al. | |
| 7,071,018 B2 | 7/2006 | Mason et al. | |
| 7,267,721 B2 | 9/2007 | Kauzlarich et al. | |
| 7,271,333 B2 | 9/2007 | Fabick et al. | |
| 2003/0131786 A1 | 7/2003 | Kauzlarich et al. | |
| 2006/0118406 A1 | 6/2006 | Delahoy et al. | |
| 2007/0284303 A1* | 12/2007 | Drew et al. | 210/505 |

OTHER PUBLICATIONS

Yuan-Min Li et al. 'Some Observations on Seeding and Stability of nc-Si Solar Cells', Photovoltaic Specialists Conference, IEEE, Apr. 2005, pp. 1420-1423, New Jersey, USA.
J. A. Anna Selvan, 'ZnO for Thin Film Solar Cells', UFO Dissertation Band 361, Universite De Neuchatel Faculte Des Sciences, Oct. 2, 1998.

* cited by examiner

*Primary Examiner* — Gwendolyn Blackwell
(74) *Attorney, Agent, or Firm* — Gregory N. Neff, Esq.

(57) ABSTRACT

The photovoltaic structure comprises a thin film coating on a transparent substrate, the thin film comprising an effective amount of nanocrystalline silicon embedded in a matrix of amorphous and/or microcrystalline silicon. A transparent conducting oxide layer on a layer of non-conductive transparent oxide provides light-trapping capability as well as electrical conductivity where needed. A chemical vapor deposition ("CVD") reactor provides improved gas distribution to the substrates being coated in the reactor. An improved sputtering process and an improved RF plasma-enhanced CVD manufacturing method both using high levels of hydrogen in the hydrogen-silane mixture and high electrical power levels for the plasma to increase the speed and to lower the cost of manufacturing.

18 Claims, 8 Drawing Sheets

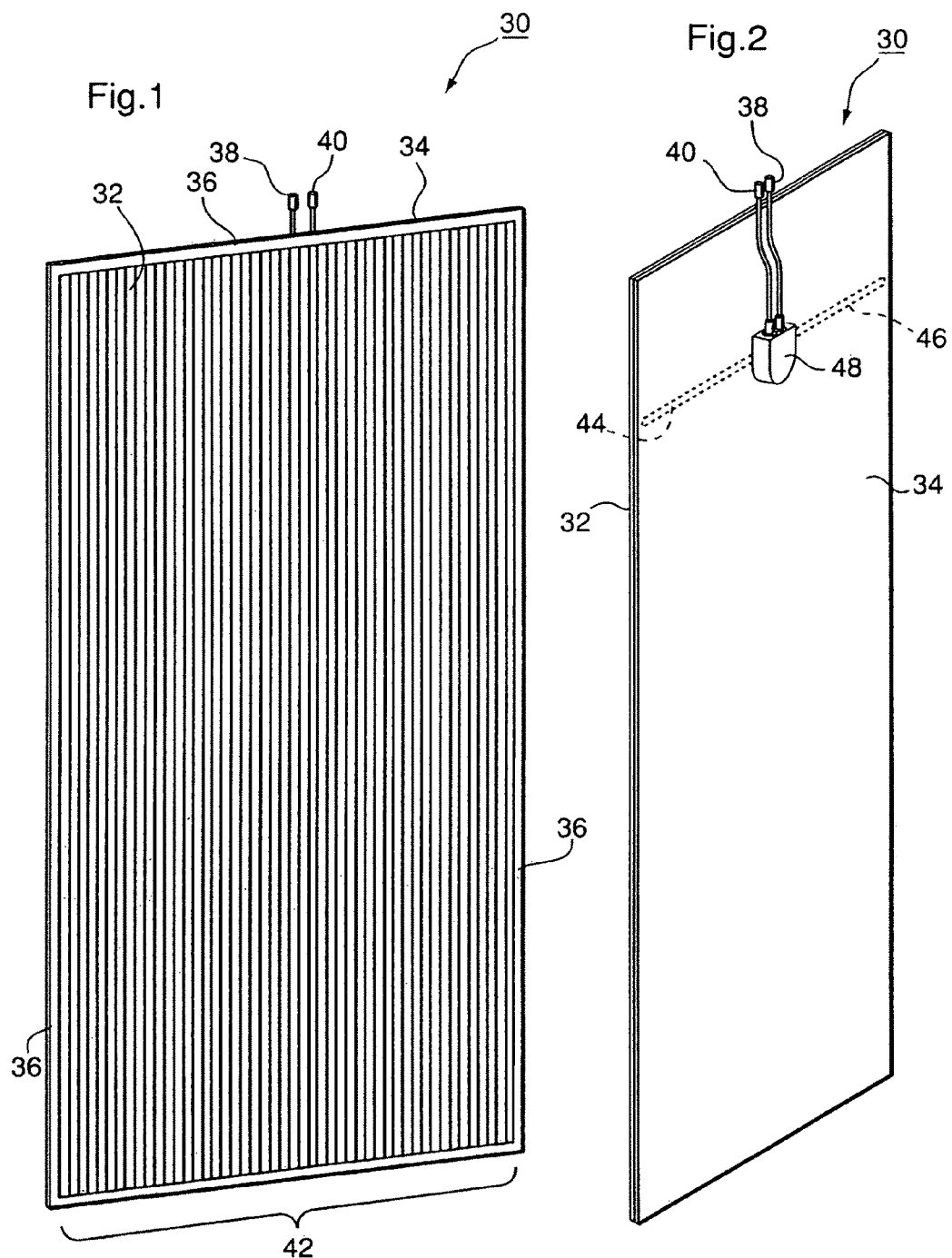

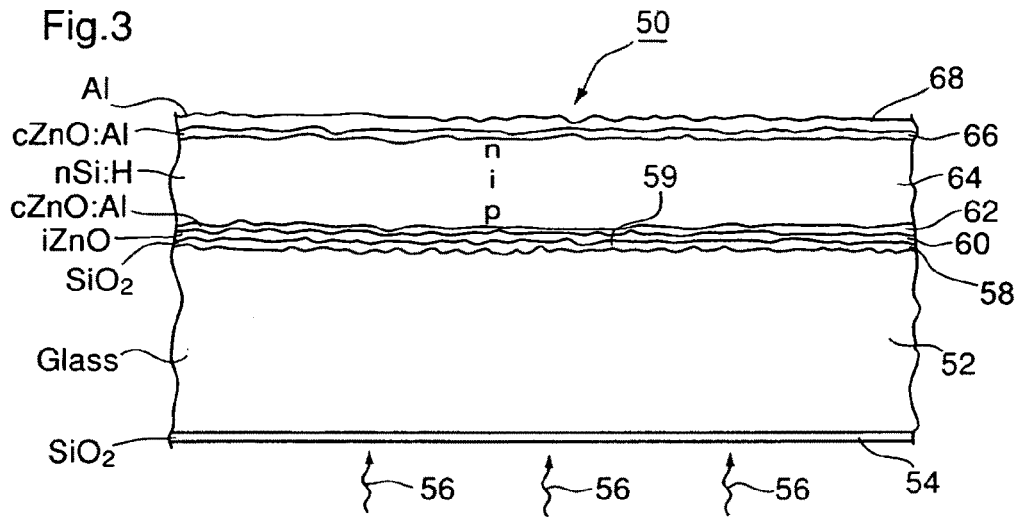
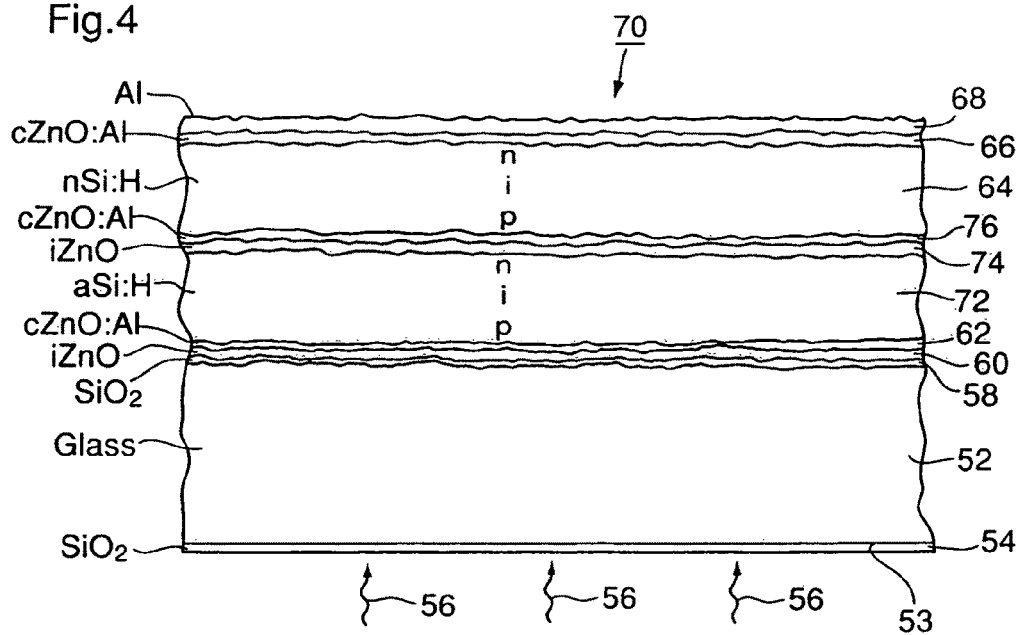

TRANSPARENT CONDUCTIVE LAYER AND METHOD

This invention relates to photovoltaic devices and methods of making them. More particularly, this invention relates to transparent conductive layers in thin-film photovoltaic devices, and to methods of making such layers.

The quest for more efficient and cost-competitive conversion of light, particularly sunlight, into electric power is long-standing continuing quest. However, for most purposes, the cost of electric energy produced by the use of photovoltaic cells still is considerably higher than the cost produced by competing methods.

One of the major cost problems with available photovoltaic cells is their relatively low efficiency, and another major problem is the manufacturing cost of such devices.

Accordingly, it is an object of the present invention to provide relatively low-cost photovoltaic devices which will convert light into electrical energy with a relatively high efficiency.

Although improvements have been made in photovoltaic devices over the years, some of them use materials which are scarce or even rare, and whose price has increased significantly over time. Therefore, it is another object of the invention to provide a photovoltaic device which utilizes some of the most abundant and low-cost materials available for the purpose, thus protecting against future materials shortages and price increases.

Other problems include the unavailability of direct, bright sunlight under adverse conditions, such as on cloudy days, or early in the morning or late in the day. Under such conditions, the power output level of many prior photovoltaic devices falls well below desired levels.

Therefore, another object of the invention is to provide photovoltaic devices whose output remains relatively high, even under such adverse conditions.

Another problem with some prior photovoltaic devices is that they require relatively large amounts of materials, and/or the form in which the material must be used is expensive to produce.

Accordingly, it is a further object of the invention to provide a device which uses very small quantities of critical materials, and utilizes forms of such materials which are relatively low cost to make.

A further problem which has adversely affected the manufacturing cost of prior devices is the relatively slow speed at which the devices can be manufactured.

Therefore, it is yet a further object of the invention to provide a photovoltaic device which can be made at a relatively high speed, and a process to accomplish that objective.

Although some prior photovoltaic devices use bulk materials, such as bulk silicon, other devices have been developed to use thin-films instead. One such device is a thin-film photovoltaic cell using amorphous silicon. Although amorphous silicon is a relatively low cost material, it has certain shortcomings. Other thin-film devices also have shortcomings. It is an object of the present invention to provide a photovoltaic device in which as many of those shortcomings are eliminated as possible.

For example, amorphous thin-film devices suffer severely from lack of stability. In particular, the energy conversion efficiency of such devices decreases markedly starting shortly after its first use in intense light. The efficiency continues to decrease with use until, after a time, the efficiency stabilizes at a much lower level than it had when it was first manufactured.

It is an object of the present invention to provide a device which avoids or minimizes such degradation.

Another problem with amorphous silicon photovoltaic devices is that their spectral response is relatively poor. That is, the amount of current output in response to components of sunlight of longer wavelengths, is much lower than to those having shorter wavelengths, with the result that substantially less than the full spectral range of available solar energy is used to produce electrical power.

Accordingly, it is another object of the invention to provide a photovoltaic device with a considerably improved response to light having the longer wavelengths of the solar spectrum, and thus provides more electrical power output.

Another problem that exists with prior thin-film devices is in the transparent conductive ("TCO")layer. Such a layer often is used, for example, as the front electrode for the device. It should be transparent in order to allow light to enter the cell with minimal attenuation.

The transparent conductive layer often consists of doped tin oxide which is applied to the surface of the glass support member. Doped tin oxide has certain disadvantages, including relatively high cost, due to its tin content, and has been replaced, in many cases, by doped zinc oxide. The surface of the tin oxide or the zinc oxide usually is etched in order to roughen the surface of the coating and perform "light-trapping".

For various reasons, the performance of prior TCO layers has not been as good as it might be. The transmission of light, especially in the longer wavelengths has been limited. This problem is even more severe when the light received is diffuse, as on a cloudy day, than it is when direct sunlight is received.

Accordingly, it is a further object of the invention to provide an improved transparent conductive coating which transmits a greater percent of the light it receives in the longer wavelengths, from both diffused light and direct light. It also is an object to provide such a coating which is less expensive and more stable than a tin oxide coating.

In an attempt to improve upon amorphous silicon devices, polycrystalline silicon has been proposed as a replacement for amorphous silicon.

One such substance is microcrystalline silicon, with a predominance of microcrystals in the silicon. Another proposal has been to produce nanocrystalline silicon devices. However, it is believed that commercially successful devices of either type have not yet been developed.

One problem has been that the process of making microcrystalline or nanocrystalline materials in the past has been exceedingly slow and expensive. Moreover, a suitable composite structure incorporating nanocrystalline silicon has not previously been known.

Therefore, it is a further object of the present invention to provide a relatively high-speed manufacturing method for manufacturing nanocrystalline devices.

Another problem with producing nanocrystalline material, as well as other crystal material in a chemical vapor deposition (CVD) process is that when numerous substrates are placed in a reactor at the same time, it is difficult to deliver a process gas in the same concentration to all parts of the substrate.

Therefore, it is a further object of the invention to provide a CVD reactor and method in which gas is delivered evenly across the entire surface of the substrate upon which the thin-films are formed.

In accordance with the present invention, the foregoing objectives are met by a number of different new features which are set forth below.

First, a new nanocrystalline photovoltaic device is provided in which the active layer has an effective amount of nanocrystalline silicon which is embedded in a matrix of silicon having another form. Typically, the matrix consists of amorphous silicon or a combination of amorphous and microcrystalline silicon.

In one embodiment, the nanocrystalline thin-film layer is the only active layer in the device. In another embodiment, the nanocrystalline layer is used in tandem with a layer of amorphous silicon to form a composite photovoltaic device with improved characteristics.

Either the single or the tandem structure described above can be used with an improved TCO layer, which is named herein the "TCLO" layer (Transparent Conducting Light-Trapping Oxide). This layer consists of two components; a first, relatively thick layer of a metallic oxide, such as zinc oxide in its pure form and a preferably much thinner doped metallic oxide layer on top of it, such as zinc oxide doped with a small percentage of a metal such as aluminum. The thin doped oxide serves as an electrically conducting layer, and the pure zinc oxide serves as an improved light-trapping layer which is more transmissive to light in the long wavelengths than doped zinc oxide.

The TCLO layer also can be used to separate the nanocrystalline and amorphous layers in the tandem device described above.

The nanocrystalline layer can be formed by several different methods. However, a preferred method is a chemical vapor deposition ("CVD") method in which a substantial number of glass panels can be processed in a single reactor simultaneously.

Advantageously, the silane and hydrogen mixture used as the process gas is significantly altered by greatly increasing the hydrogen content relative to the silane content. In addition, a plasma is used to enhance the process. The plasma is developed by radio frequency ("RF") electrical energy, and the concentration of energy per unit area of the panels being coated is increased greatly over the maximum levels used in the past. Other process variables also are increased substantially.

Preferably, the process gas is delivered to the surfaces of the multiple panels in the reactor evenly and rapidly by the use of a manifold distributing gas to a plurality of hollow, conduits, each with multiple evenly-spaced fine holes in the sides so as to deliver the gas to the panel surfaces in small jets at many locations distributed over the surface of the panels.

The result of the method is a significant increase in speed in the process of forming the nanocrystalline material, and a corresponding reduction of manufacturing cost.

The result of the various features of the invention is the production of an improved high-performance, low cost photovoltaic module which promises to significantly lower the cost of converting light into electrical power.

The foregoing objects and advantages of the invention are described in or made apparent by the following description and drawings.

IN THE DRAWINGS:

FIG. 1 is a front perspective view of a photovoltaic panel or module constructed in accordance with the present invention;

FIG. 2 is a rear perspective view of the panel shown in FIG. 1;

FIG. 3 is an enlarged, partially schematic cross sectional view of one embodiment of a thin-film photovoltaic cell constructed in accordance with the invention;

FIG. 4 is a view like that in FIG. 3 of another embodiment of a photovoltaic cell constructed in accordance with the invention;

PHOTOVOLTAIC MODULE

Figure 5:
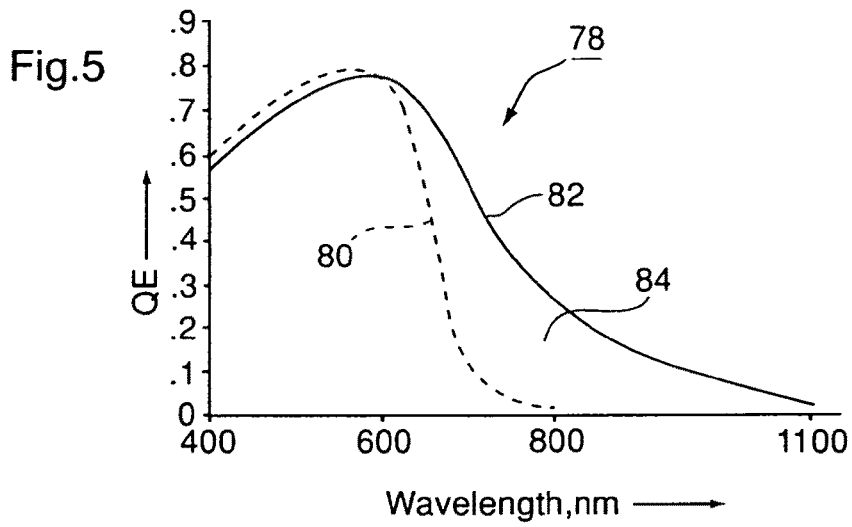
FIGS. 5 and 6 are graphs illustrating features of the photovoltaic devices of the invention.

FIG. 1 is a front perspective view of a photovoltaic panel or module constructed in accordance with the present invention. The panel 30 is of a standard size, approximately 26 inches in width and 55 inches in length (0.666 meter by 1.40 meters) which is useful for mounting on rooftops, surfacing the sides of buildings, positioning in fields as the active elements in solar energy farms, and the like.

The panels are particularly well suited for the conversion of sunlight into electrical energy, but also can be used, in smaller or larger sizes, for the conversion of light from indoor lighting and other sources into electrical energy.

Each panel 30 has a front glass plate 32, and a rear glass plate 34 (see FIG. 2) secured to it. Each glass plate has a border area 36 which can fit into a frame for use in mounting the panel. The rear glass plate 34 serves the purpose of protecting the metalized rear surface of the front glass plate 32, and adds structural strength to the panel.

The panel has a pair of electrical leads 38 and 40 for use in connecting the panel 32 to other panels, or to equipment such as DC-to-AC converters, storage batteries, or other utilization devices.

The panel 30 includes a thin-film photovoltaic structure formed on the inner surface of the front glass plate 32. That thin-film structure is separated by the well known process of "scribing", into 50 parallel interconnected strips 42.

The photovoltaic cell on each strip is connected in series to the cell on the next strip so that all of the 50 cells are connected in series to one another across the width of the panel 30 so as to add the voltage produced in each strip to that produced by the next one. If for example, each strip, when in full, direct sunlight, produces approximately 600 millivolts, the total voltage produced by the panel is approximately 30 volts. However, the voltage output will depend on the number of cells connected together, and the type of cells used.

One contact of the edge side of the series-connected strips is connected electrically by an aluminum foil strip 44 to a junction box 48, and another aluminum strip 46 connects the opposite edge of the cells to the same junction box. Those contacts are connected in the junction box to the electrical leads 38 and 40.

The electrical current output from the panel 30 when in full, direct sunlight will depend on the type of cells used, as well as the total surface area of the panel.

The panel 30 typically will produce more than 100 watts of electrical power in direct sunlight.

The panel 30 is black in color. However, the panel can be given colors other than black by use of techniques well known in the art. The panel 30 can be made so that it transmits no light through the panel, or it can be made to transmit a portion of the light it receives so as to allow some light into the interior of a building in which it might be used as an outside window or decorative panel.

Thin-Film Nanocrystalline Device

FIG. 3 is a greatly enlarged, broken-away schematic cross sectional view of a thin-film photovoltaic cell 50 constructed in accordance with the present invention.

The cell 50 shown in FIG. 3 consists of a glass substrate 52 designed to receive light in the direction indicated by the arrows 56 and transmit it to the thin-film layers on the upper surface of the glass substrate, where it is converted to electrical energy.

It should be noted that the bottom surface of the glass plate 52 usually is smooth, as it would come from a manufacturing facility using the float glass process. The glass can be ordinary soda-lime glass, but preferably is low-iron-content glass, both of which are readily available and of moderate cost.

It is preferred that the upper surface 59 of the glass be "textured", as by etching, so as to maximize the amount of light retained within the cell and used to generate electrical energy.

The bottom or front surface 53 of the glass has a coating 54 of silicon dioxide (SiO2). The front surface 53 of the glass usually is smooth and needs the coating to minimize reflection and maximize the absorption of sunlight into the glass through the front surface.

Various layers of materials deposited on the upper surface of the glass shown in FIG. 3 are defined by wavy lines. The wavy shape of these lines indicates schematically that the surface is roughened, although the recesses in the surface preferably would be so very small that they could not be seen by the naked eye and would not be visible in the drawings.

The first layer 58 on the upper textured surface of the glass substrate 52 is another layer of silicon dioxide, which, as it is well known, serves as a diffusion barrier.

In accordance with one feature of the invention, instead of the usual TCO (Transparent Conductive Oxide) layer, there has been provide a composite layer consisting of a first layer 60 of pure or "intrinsic" Zinc Oxide ("iZnO") with an etched upper surface and a substantially thinner layer 62 on top of the Zinc Oxide. The layer 62 consists of Zinc Oxide doped with from 1.5% to 5% of a known metallic doping material to make the layer 62 electrically conductive. The Zinc Oxide can be doped with aluminum, gallium, indium or boron, as it is well known. However, aluminum is preferred.

The composite layer consisting of intrinsic Zinc Oxide with conductive Zinc Oxide, will be referred to herein as the "TCLO" layer. It is highly advantageous in that it provides the electrically conductive layer needed to form the front contact of the photovoltaic cell, but significantly improves the transmission of light, especially in the longer wavelengths and is significantly more stable than substances such as tin oxide (SbO2), which often loses some of its transmissiveness when subjected to a hydrogen atmosphere used in CVD reactor manufacturing.

The TCLO layer not only improves the transmission of direct light, but it also improves the transmission of diffuse light.

The use of such a TCLO composite layer is highly advantageous. A cell using it produces a significant increase in the output current density as compared with prior TCO coatings.

The layer 64 formed on top of the layer 62 is the active layer of the cell, and it utilizes another novel feature of the invention, that is, the layer 64 contains an effective amount of nanocrystalline silicon.

Layer 64 is shown much thicker than the other layers, simply for the ease of showing its internal structure.

The lower portion of the layer 64 is p-type nanocrystalline silicon, the upper portion is n-type nanocrystalline silicon, and the intermediate section is "i" or intrinsic (undoped) nanocrystalline silicon.

Figure 7A:
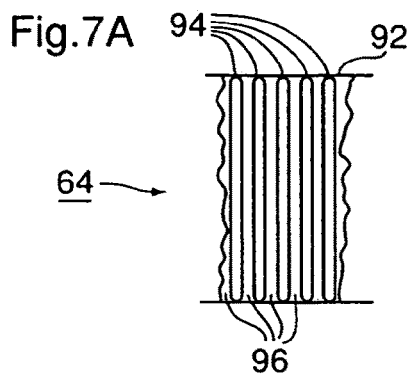
FIGS. 7A and 7B are cross-sectional, enlarged schematic views illustrating the crystalline structure of a portion of the active thin-film layer of a photovoltaic cell consisting primarily of microcrystalline silicon (FIG. 7A) and nanocrystalline silicon (FIG. 7B)

FIG. 7A shows layer 64 schematically as it might look at a high degree of magnification if it were made of microcrystalline silicon. Long, thin microcrystals 94 are embedded in a matrix 96 consisting primarily of amorphous silicon.

Figure 7B:
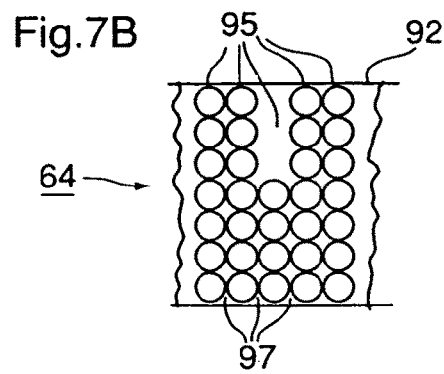

FIG. 7B shows the same layer 64 if made primarily of nanocrystalline silicon. The crystal structures are made of "grains" which have a width similar to the width of the microcrystals, but are considerably shorter in height.

Silicon "nanocrystals" are defined herein as being individual crystals between one half of a nanometer (0.5 nm) to approximately ten nanometers (10 nm) in width, and from ten to one hundred nanometers (10 nm to 100 nm) in length.

"Microcrystals" are defined as crystals of silicon between around the same width or wider, up to one hundred nanometers (100 nm) and from one hundred to four hundred nanometers (100 nm to 400 nm) in length.

Amorphous silicon is, of course, non-crystalline.

In the process to be described below in which the nanocrystalline material of layer 64 is made, the matrix in which the nanocrystals are formed is predominantly amorphous, but as noted above, some microcrystals might be present in addition.

An "effective" amount of nanocrystalline material is at least 30% by weight of the material in the active layer. A "predominance" of nanocrystalline material is in excess of 50%. Although there is no upper limit, at amounts above about 70%, further increases may give diminishing returns. Therefore, a preferred range is 30% to 70% nanocrystalline material.

The provision of an effective amount, or a predominance of nanocrystalline material for the active layer 64 of the device 50 is highly advantageous. The presence of the nanocrystalline material is believed to significantly improve the quantum efficiency ("QE") of the solar cell. In addition, the nanocrystalline layers can be deposited to form a commercially acceptable device at a substantially faster rate than in prior thin film silicon devices.

Furthermore, as compared with amorphous silicon cells, nanocrystalline silicon cells made as described herein offer a significant improvement in efficiency. As it is well-known, the efficiency of amorphous silicon devices becomes degraded with time. This serious defect is substantially eliminated by the present invention.

The next layer 66 on top of the active layer 64 is another layer of doped zinc oxide which is conductive. It is used as a diffusion barrier and an anti-reflection coating.

The final coating is a coating of aluminum 68 which serves as the back electrode for the photovoltaic cell.

Figure 6:
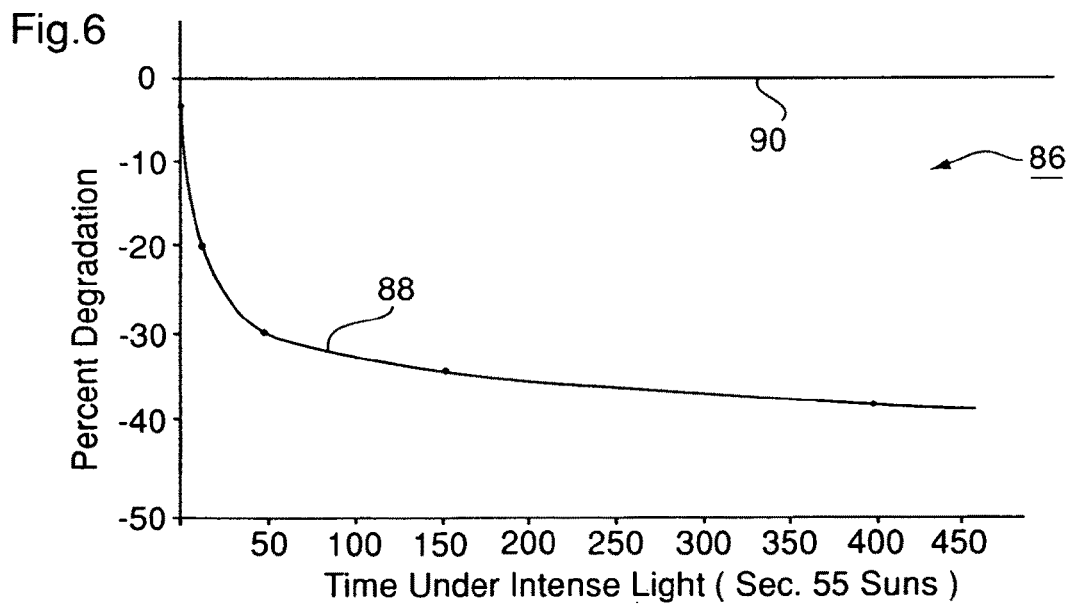

FIGS. 5 and 6 show graphs illustrating the improved characteristics of nanocrystalline and microcrystalline silicon devices as compared with amorphous silicon devices.

The dashed-line curve 80 in FIG. 5 is a plot showing the Quantum Efficiency ("QE") of typical amorphous cells plotted against the wavelength of the light received. The plot covers the region of the electromagnetic spectrum from four hundred to eleven hundred nanometers (400 nm to 1,100 nm).

It is clear that the nanocrystalline response curve 82 gives a much greater Quantum Efficiency and conversion of light into electrical energy in the area 84 between the curves 80 and 82. For example, at 800 nm, the QE of curve 82 is over 0.2 while that for curve 80 is near zero. This represents a significant increase in current and voltage output for the crystalline devices over the amorphous device.

FIG. 6 shows the percent degradation in electrical output by the nanocrystalline material at 90, and the curve 88 shows the degradation of an amorphous device over time, both under exposure to very intense artificial light equivalent to 55 times the intensity of direct sunlight.

In actual use in sunlight, the amorphous device usually stabilizes in 30 to 80 days, and then does not deteriorate further during its remaining life.

During the same periods of time, the nanocrystalline device of the invention shows little, if any, deterioration.

It is believed that the difference in conversion efficiency between amorphous devices and those of the invention persists over a period of years, and in fact, for the duration of the useful lives of the devices.

Although microcrystalline silicon exhibits some of the same advantages of nanocrystalline material, the time required to manufacture it is very significantly greater than the time using the novel process of the present patent application to make the nanocrystalline material, as it will be described in greater detail below.

Moreover, it is believed that the nanocrystalline devices will supply a higher voltage output per cell (550 to 600 millivolts, as compared with the prior 400 to 500 millivolts) and a higher current output (e.g., over 20 and up to 26 milliamps per square centimeter of cell surface area compared with less than 20 milliamps previously).

Figure 8:
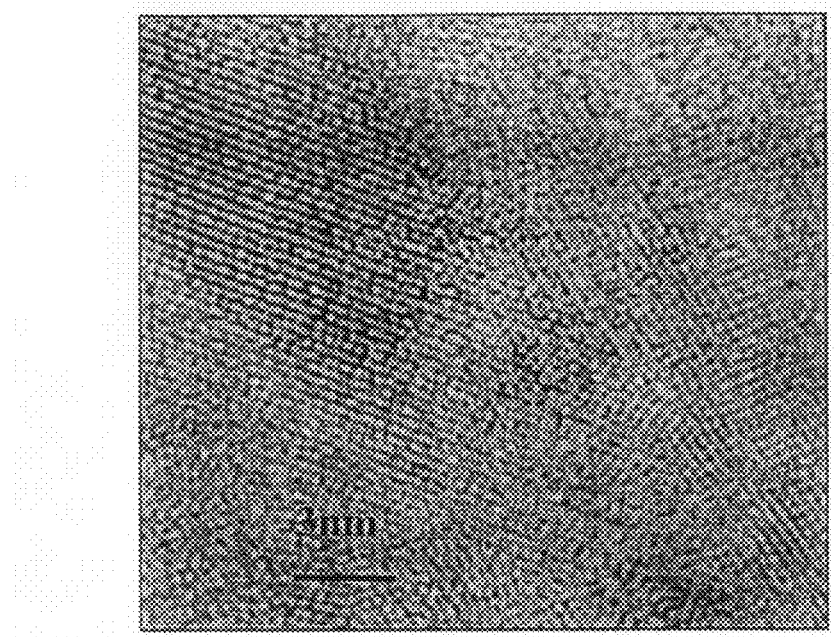
FIG. 8 is a photomicrograph of a cross section cut through a layer of nanocrystalline material made in accordance with the present invention.
Figure 9:
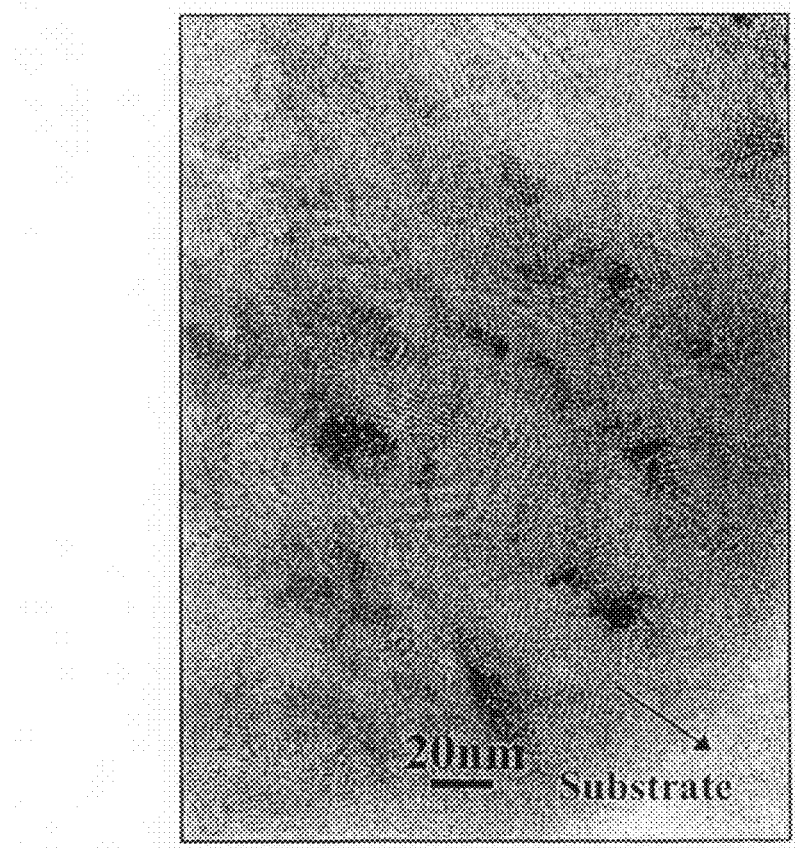
FIG. 9 is a photomicrograph, similar to that in FIG. 8, of the nanocrystalline material shown there, but at a lower magnification.

FIGS. 8 and 9 are photomicrographs made by a Transmission Electron Microscope of a nanocrystalline silicon layer in cross section.

FIG. 9 shows that the crystals are aligned in the direction of the arrow, which is substantially perpendicular to the substrate which is below and to the right.

FIG. 8, which is enlarged even more than the photograph of FIG. 9, shows a portion of the same surface of the material at approximately the atomic level.

Every black dot in FIG. 8 represents an atom. A regular line of atoms represents a crystalline lattice. It can be seen in both figures that there are nanocrystalline grains.

Crystalline domains of the size of several nanometers to a couple of tens of nanometers are seen. They are surrounded by irregular grain boundaries, which are amorphous in nature. The grain boundaries and dangling bonds are passivated with atomic hydrogen (not seen in the picture). The hydrogen content can be evaluated by infrared spectroscopy.

FIG. 9 shows the nanocrystalline silicon grains grown one over the other. At the bottom of the grains is the glass substrate. Such a structure increases the internal light scattering and absorption of the light inside the thin-film. This feature increases the short circuit current density of the cell.

The transport of the minority charge carriers (positive and negative photo carriers) occurs with minimum scattering through the nanocrystalline grains because of the aligned nature of the nanocrystalline grains and effective passivation of the grain boundaries and recombination centers (dangling bonds, traps).

The presence and quantities of nanocrystalline silicon in a layer can be detected by known techniques such as Raman spectroscopy, X-ray diffraction analysis, High-Resolution Transmission Electron Microscopic analysis and/or infrared spectroscopy.

Tandem Device

FIG. 4 shows a tandem photovoltaic device 70 similar to the device 50 shown in FIG. 3, except that an amorphous silicon layer is formed first on the substrate, and then a nanocrystalline layer is formed on top of the amorphous layer.

Specifically, the amorphous silicon layer 72 is formed on the conducting zinc oxide layer 62. Then, another TCLO composite layer is formed on top of the amorphous silicon layer. The TCLO composite consists of iZnO layer 74 with a doped ZnO (cZno) layer 76 on top. The composite layer 74, 76 serves the same purpose as the first TCLO layer. The nanocrystalline silicon layer 64 is built on top of the TCLO structure 74, 76.

The tandem device 70 takes advantage of the different band gaps of the amorphous and nanocrystalline materials to provide higher output voltage and power levels than a nanocrystalline device such as the device 50 shown in FIG. 3.

For example, the nanocrystalline layer can produce a voltage of 600 millivolts per cell, and the amorphous layer can produce 900 millivolts. The total voltage of the cell is the sum of the individual voltages, or 1.5 volts. The current output usually will be somewhat lower, e.g. 16 to 17 per square centimeter versus 20 to 26 ma/cm$^2$, but the power output will be significantly greater.

Advantageously, the tandem device does not suffer from as much conversion efficiency degradation as a solely amorphous silicon device.

Manufacturing Process

The devices shown in FIGS. 3 and 4 above can be manufactured in at least two different ways; one is by the use of chemical vapor deposition ("CVD"), and the other is by sputtering.

Chemical Vapor Deposition

Figure 10:
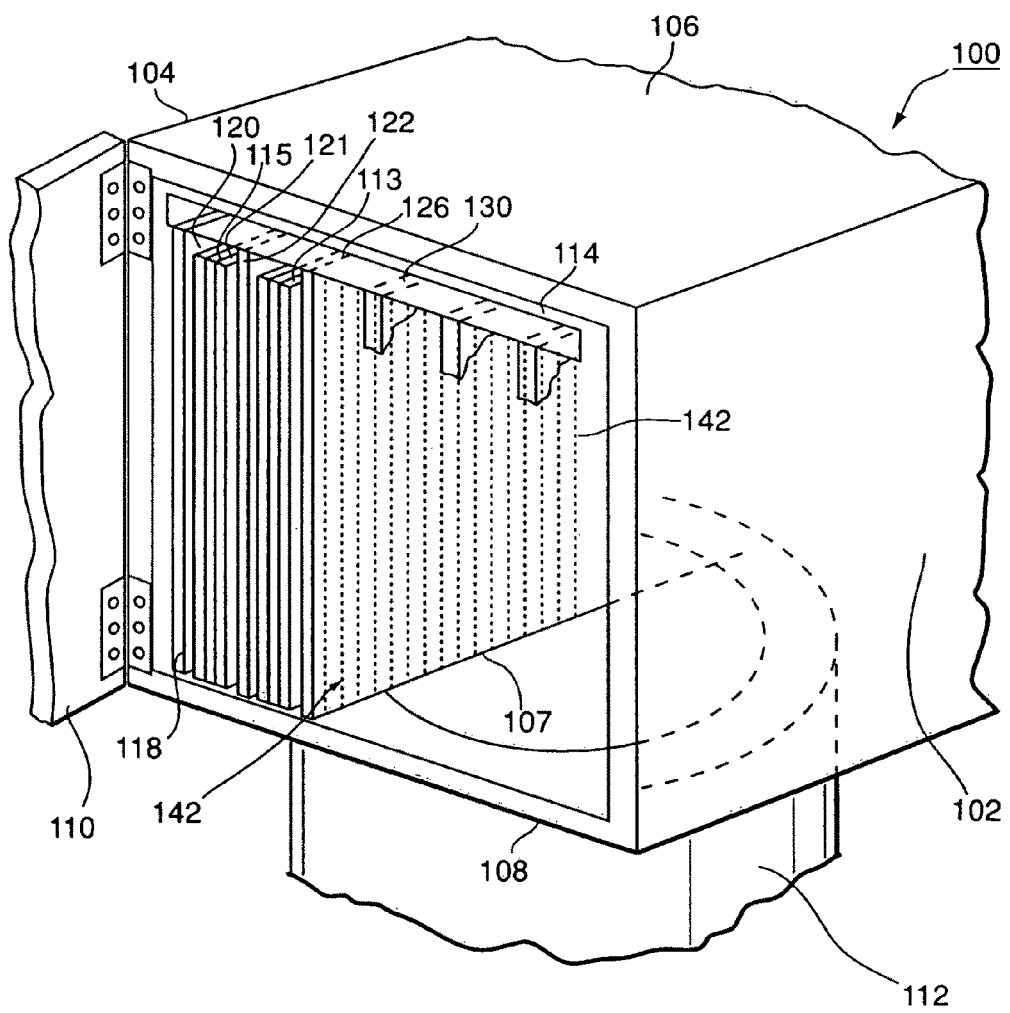
FIG. 10 is a perspective, partially schematic view of a chemical vapor deposition reactor constructed in accordance with the present invention.

FIG. 10 is perspective view of a Chemical vapor Deposition ("CVD") reactor 100 which can be used to great advantage in manufacturing the photovoltaic devices of the invention.

The reactor 100 includes insulated side walls 102 and 104, a top wall 106 and a bottom wall 108. A rear wall also is provided but is not shown in FIG. 10 because the rearwardly extending portion of the reactor has been broken away to enhance the visibility of the device in the drawings.

A hinged door 110 is provided. It is shut tightly when the reactor is in use, and has an air-tight seal to help maintain a very low pressure in the reactor chamber when it is in operation.

A conventional vacuum pump 112 is provided with its entrance opening into the bottom of the reactor to create and maintain very low pressure in the reactor. The reactor is heated by well-known means to relatively high internal temperature, up to 450° C., during operation.

Figure 11:
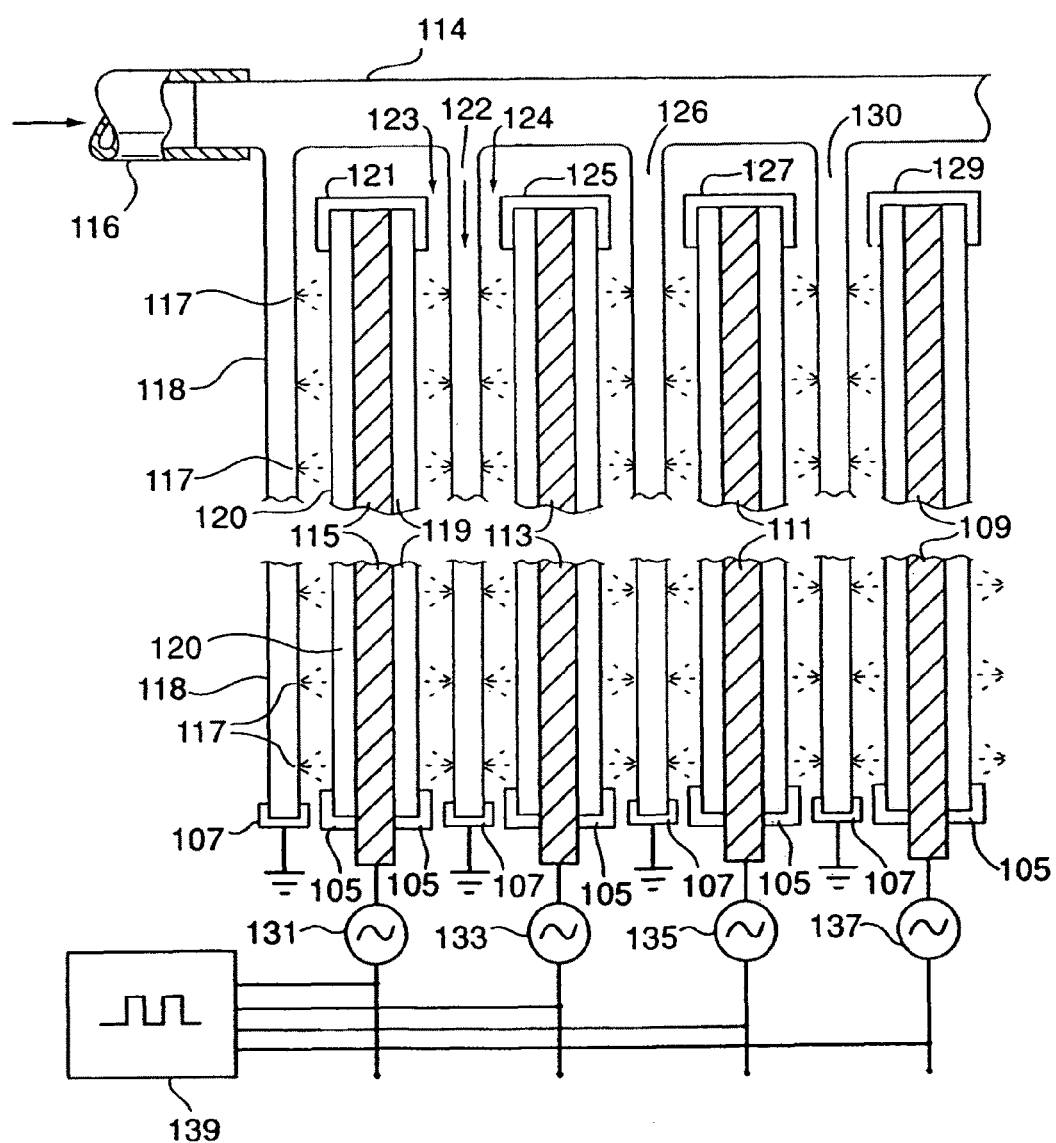
FIG. 11 is an enlarged end elevation view, partially schematic, of a portion of the structure shown in FIG. 10.
Figure 12:
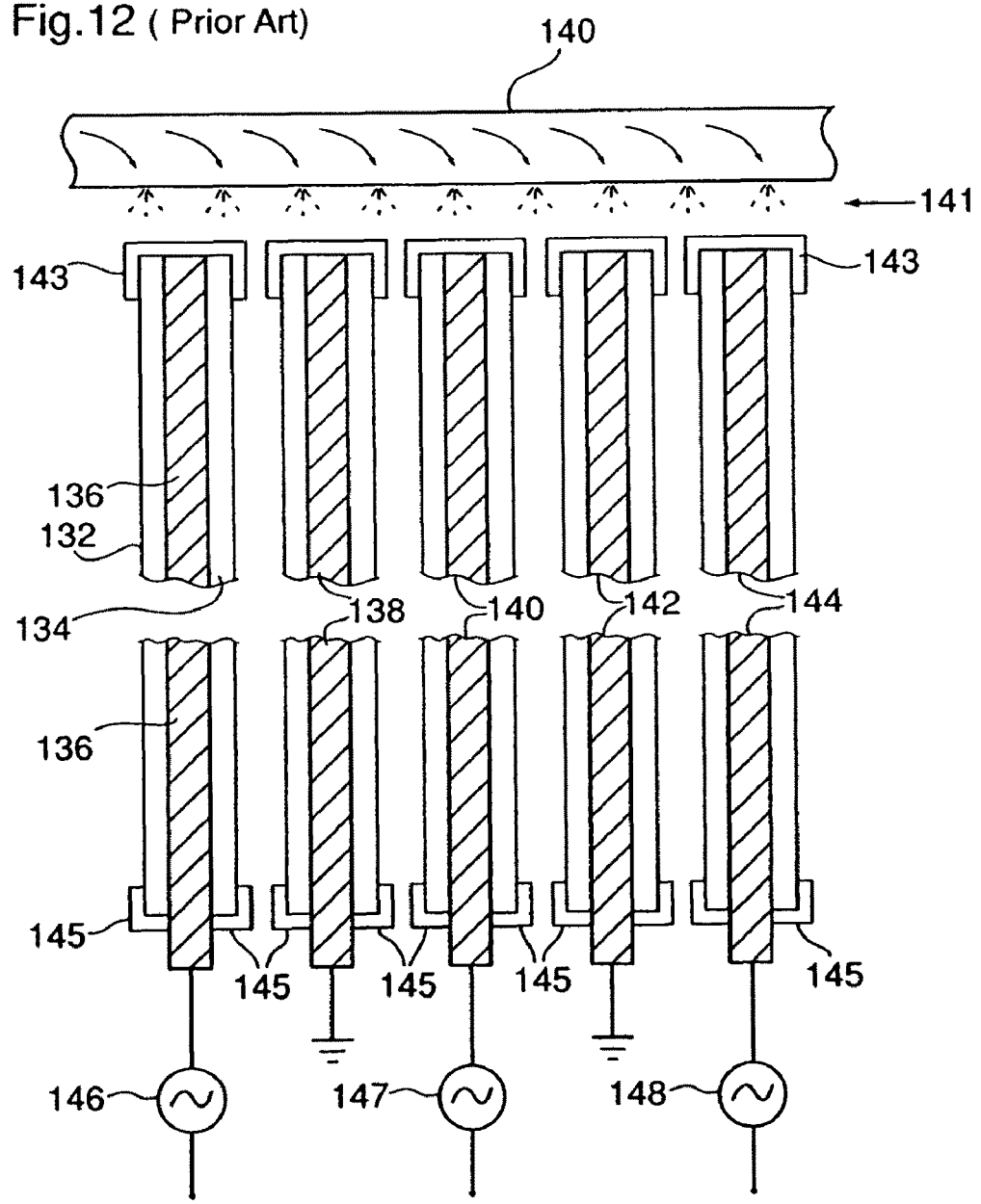
FIG. 12 is a view similar to that in FIG. 11 of a prior art reactor construction which also can be used in performing the process of the present invention.

FIGS. 10-12 show two different structural arrangements for delivering gas to the glass substrates to be coated in the reactor. FIGS. 10 and 11 show schematically a structure improved by a feature of the invention, and FIG. 12 shows schematically the gas delivery system of a conventional reactor.

Referring first to the conventional structure shown in FIG. 12, glass plates to be coated are arranged inside the reactor in pairs. FIG. 12 is cross-sectional end elevation view showing five pairs such as the pair 132, 134. The glass plates are arranged with their front surfaces contacting a very flat aluminum plate 136, 138, 140, 142 or 144, and a lower support angle member 145, and an upper channel member 143. The members 145 and 143 preferably, are made of a non-conductive plastic material which will maintain its shape at high temperatures, such as fluropolymers like DuPont "Teflon". The outside surfaces of the glass plates to be coated are exposed to the gas in the reactor, while the front surfaces are flush against the metal plates 136, etc., out of contact with the gas. It is these outside surfaces which are to be coated.

Each aluminum plate support structure 136, 143, 145 also provides an electrically conductive frame for application of RF signals to the glass plates to form a plasma, as it will be described below.

Still referring to FIG. 12, process gas is delivered to a manifold 140 which has numerous very small holes in its bottom wall. Process gas is fed, under a slight positive pressure, into the manifold 140 to deliver the gas downwardly through the small holes to form many small gas jets 141. The gas flows downwardly towards the vacuum pump 112 and makes contact with the exposed surfaces of the glass plates on the way. The glass plates are very closely spaced, typically by a distance of 6 to 32 mm from one another.

A source 146, 147 or 148, etc. of radio frequency ("RF") electrical signals is connected to every other plate 136 holding the pairs of glass plates. The intermediate pairs are grounded, as shown in FIG. 12. These RF sources set up an electromagnetic field in the open spaces between the glass plates. As it is well known, the RF fields create a plasma in the argon-containing process gas which assists in depositing components of the gas on the exposed gas plate surfaces to form thin-film coatings.

In a typical process which has been used in the past to produce thin-film amorphous silicon coatings, silane gas mixed with hydrogen and argon are fed into the reactor chamber through the manifold 140 and the gas jets 141.

The glass plates upon which the active silicon layer is to be formed preferable already is coated with a silicon dioxide anti-reflective coating on the front surfaces, and a TCO coating on the opposite surface, the one to be coated. These coatings usually are formed by sputtering equipment.

A RF signal of a suitable frequency such as 13.56 megahertz, or a multiple of that frequency, is generated by the RF generators to develop a plasma in the argon-silane-hydrogen gas mixture. This causes the silane to become dissociated into silicon and hydrogen, the resulting materials having the formula Si+2H2.

First 3% or so of trimethylboron is used in the gas to make the p layer of silicon, after which the undoped or intrinsic layer of silicon is formed, and then phosphine ($PH_3$) at a rate of about 3% by weight is mixed in with the starting gases to form the layer of n-type silicon.

The resulting product preferably is sent to a sputtering line to lay down the transparent conductive oxide (TCO) and the metal electrode layer to finish the device.

As it is well known, intermediate scribing steps may be performed at various points in the process in order to form the individual cells 42 (FIG. 1) and interconnect the cells in series as described above. These steps are well known and will not be described in detail here.

Although the structure shown in FIG. 12 may be used to manufacture the photovoltaic structures of the invention, the preferred reactor is shown in FIGS. 10 and 11.

As it is shown in FIGS. 10 and 11, interspersed between adjacent pairs of glass plates such as plates 119, 120 supported by the metal plates 115, 113, 111 and 109, and fluoropolymer channels 121, 125, 127, 129, etc and angles 105, are descending hollow gas distribution conduits 118, 122, 126, 130, etc. These conduits are shaped like and are approximately of the same area as the glass plates. Each of the conduits has a plurality of very small holes 142 (FIG. 10) in both side walls, except for the conduit 118 which has holes in only one side wall, the wall facing the left surface of the glass plate 120. Similarly, a distribution conduit at the opposite end of the reactor (not shown) has holes in only the surface facing towards the nearest glass plate.

As it is indicated at 117, 123 and 124 in FIG. 11, for example, each of the small holes in the conduit walls produces a tiny jet of gas which is directed toward one of the glass plate surfaces to be coated. In this manner, gas is distributed substantially evenly across the entire surface of each of the glass plates so as to assure fresh gas reaching substantially all areas of each glass plate in approximately equal concentrations. This is believed to allow for the use of a much higher flow rate of gas than otherwise would be possible due to the fact that, without the conduits 118, 122, etc., the gas concentration likely would change materially as the gas flows from the top to the bottom of the reactor.

Preferably, the gas is delivered from a manifold 114 through an inlet pipe 116 which can enter the housing through the rear wall, for example, with suitable vacuum-tight seals around the entrance. If the entrance 116 is in the rear wall of the reactor 100, it would be facing away from the paper on which FIG. 11 appears. However, it is shown entering from the left, for the sake of convenience in the drawings.

By means of such a construction, the entire manifold 114 and all of the distribution conduits 118, 122, etc. can be removed as a unit from the reactor housing by disconnecting the coupling 116 and sliding the unit in metal support tracks 107 through the front opening of the reactor so that the entire unit can be removed and replaced for cleaning.

Preferably, the manifold 114 and the other components are all made of a metal which is resistant to corrosion by the gases and plasmas used in the reactor, and can maintain its strength and shape at the temperatures used in the reactor. Stainless steel is a desirable material for this purpose, but aluminum also can be used.

As it is shown in FIG. 11, the electrical connections of the metal frames and the distribution conduits is different from that shown in FIG. 12. In the FIG. 11 arrangement, a RF generator 131, 133, 138 or 137 is connected to each of the glass frames and the distribution conduits are grounded. It is possible to reverse the connections, with the distribution conduits plates connected to the generators and the glass plates grounded. The object of this is to assure that there is no barrier between a distribution conduit and the glass plate to prevent a plasma from forming between the two to assist in the deposition process.

A signal supply unit 139 is provided for supplying a negative 3 volt DC bias and a low-frequency modulating signal to each RF source, for purposes to be described below.

Process Parameters

Regardless of whether the gas distribution system of FIG. 11 or FIG. 12 is used, the process parameters for making nanocrystalline devices depend upon making wide departures from prior practices.

Specifically, two parameters of the process are quite significant. First, the ratio of the quantity of hydrogen to the quantity of silane in the process gas should be from approximately ten to around five hundred. This is in contrast to prior practices used in making amorphous or microcrystalline silicon where the ratio of hydrogen to silane is believed to be less than ten.

Secondly, whereas typical prior art practice are believed to use a RF power output of around one half of one kilowatt per square meter of glass to be coated, in accordance with the invention, the power level is to be increased to the range of from approximately one to ten kilowatts per square meter.

Although the above parameters are believed to be the most significant, other parameters also should be adjusted significantly upwardly.

The process gas input flow rate should be increased up to fifty standard liters per minute. This is in contrast to much lower flow rates which are believed to have been used in the past.

Also, the temperature range should be increased from the usual range of 200° C. to 400° C. to a range from less than 200° C. to 450° C.

Finally, the working pressure should range up to a maximum of approximately of ten torr.

Before the process is started, the vacuum pump is used to evacuate the reactor to a very low pressure of $10^{-6}$ millitorr. This clears all of the excess gases from the reactor before the start of the process.

When the process gas is delivered, the working pressure in the reactor should be maintained in the range from 10 torr down to $10^{-3}$ torr.

In accordance with another feature, the RF signals delivered to the reactor from the RF supplies are modified by supplying from the source 139 a negative three volt DC (−3V DC) bias signal to the input of each generator.

In addition, each RF source should be pulsed to turn it off and on at the rate of about one hundred cycles per second or so.

The negative three volt DC bias for each source is provided in order to slow down ions as they bombard the glass surfaces being coated so as to prevent damage to the coatings from the excess bombardment.

The pulsing of each of the RF sources at a low rate of around one hundred cycles per second provides gaps in the power delivery which is believed to help the nanocrystals to develop and also helps prevent damage due to constant ion bombardment of the crystalline layers being formed.

The great increase in the ratio of hydrogen to silane in the process gas mixture is believed to be highly advantageous. It is believed that the great increase of hydrogen accelerates nucleation on the surfaces where the thin-films are deposited. Also, since hydrogen is used in the mixture for the known purpose of filling loose bonds so as to minimize recombination, its use in such great quantities is believed to have the further beneficial purpose of insuring that clean, fresh hydrogen is abundantly available to maximize the beneficial hydrogen activity and minimize recombination in the silicon layers.

As a result of the foregoing, if the hydrogen levels are maintained in the range given above, and if the power levels are similarly maintained at a high level, it is believed to be assured that a predominance of nanocrystalline silicon will be formed in the active layer of the device.

Not only does the resulting device have all of the fine characteristics described above for nanocrystalline silicon, but the manufacturing process is believed to be much faster than the prior processes useful in production processing of photovoltaic cells. In fact, whereas the highest rate believed to be actually achieved for forming amorphous and microcrystalline silicon to produce acceptable commercial products is around one angstrom per second, it is believed that the present process will produce the nanocrystalline material at the rate up to thirty five angstroms per second.

Following is a table showing three Examples of typical sets of parameters which can be used to advantage in making nanocrystalline photovoltaic devices using the invention.

| Parameters | Example 1 | Example 2 | Example 3 |
| --- | --- | --- | --- |
| (a) hydrogen to silane ratio | 30 | 80 | 250 |
| (b) RF power in watts per square meter | 800 | 1000 | 3000 |
| (c) Flow Rate in standard liters per minute | 50 | 125 | 380 |
| (d) Temperature Range | 190 | 200 | 250 |
| (e) Pressure range | 0.5 m Torr | 1 Torr | 10 Torr |
| (f) Pulse rate | 1-100 HZ | 1 KHZ | 100 KHZ |

Sputtering Method

In the sputtering process, the glass substrate has a coating of silicon dioxide anti-reflecting material on the front surface, and a TCLO coating as described above on the opposite surface.

The plate is placed in the first sputtering chamber on a metal (aluminum or silver) support plate. An RF source is attached to the plate and the chamber is evacuated and the substrate is heated.

The substrate then is moved to a second chamber in which to grow the nanocrystalline silicon layer. The target used is pure silicon. The sputtering gas in the chamber is hydrogen, argon and, in sequence, polymethylboron or diborane with nitrogen.

Alternatively, a doped silicon target can be used with a mixture of argon plus hydrogen as the sputtering gas.

The third and fourth chambers contain a pure silicon target with hydrogen and argon as the sputtering gas to form the intrinsic layer.

The fifth chamber contains a silicon target with phosphine gas mixed with the hydrogen plus argon sputtering gas or a phosphorus-doped silicon target with hydrogen plus argon.

The sixth chamber is used to anneal and heat treat the plate up to 250 degrees centigrade.

The seventh chamber is used to cool down the plate, and the eight chamber is used for unloading the plate.

Subsequently, TCO and metal contact layers are added, preferably in further sputtering chambers.

The relatively high level of hydrogen gas and relatively high RF power levels and bias and control voltages and gas flow rates as specified above for the CVD process also should be used in the sputtering chambers.

Transparent Conducting Light-Trapping ("TCLO") Substrate

Figure 13:
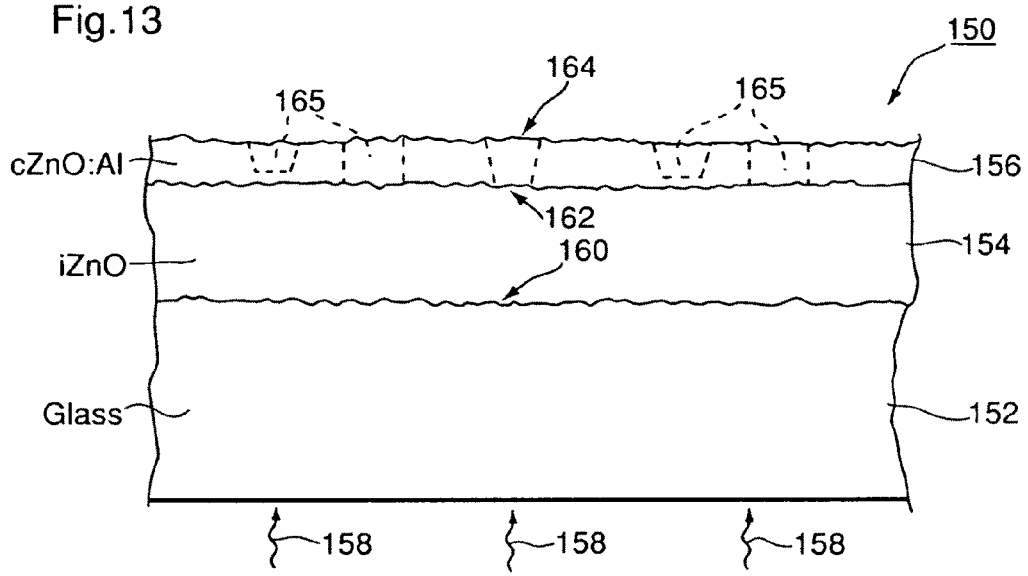
FIG. 13 is an enlarged, schematic cross-sectional view of a conductively-coated glass panel which is useful as a building block for thin-firm photovoltaic devices, including those described elsewhere herein.

FIG. 13 is a cross-sectional, broken-away view of a TCLO coated substrate 150 which forms the foundation for thin-film photovoltaic devices like those shown in FIGS. 3 and 4 above.

The layers of silicon dioxide used in those devices have been omitted from FIG. 13 for the sake of simplicity in the drawings.

The TCLO substrate includes a glass substrate member 152, with a layer of pure zinc oxide (iZnO) 154 and a layer of conductive zinc oxide 15b (cZnO:Al) on top.

Substrate 150, preferably with the addition of silicon dioxide layers as shown in FIGS. 3 and 4, forms a distinct product which can be made and supplied to photovoltaic cell manufacturers as a highly desirable building block. It also can be made by such manufacturers as a part of the cell fabrication process.

The glass substrate 152 preferably is low-iron glass, but may be soda-lime glass, or another material that is transparent to electromagnetic radiation including visible light, and can withstand temperatures up to approximately 450° C. and has a low reactivity to hydrogen plasma.

To enhance the ability to trap light, the upper surface 160 of the glass should be roughened, as by etching. The sizes of the resulting surface irregularities ideally would be of the same order of magnitude as the wavelengths of light being transmitted, or as close to that size as is available at a reasonable cost.

The various layers that are formed on the substrate 152 preferably are formed by a series of sputtering steps in an inline sputtering system consisting of several sputtering chambers in series, akin to an assembly line.

The sputtering process used in any given sputtering chamber may be a DC sputtering process, an rf-sputtering process, a magnetron sputtering process, or any other suitable sputtering process.

Layer of Pure Zinc Oxide

Referring again to FIG. 13, a layer 154 of substantially pure, undoped zinc oxide (ZnO), known as intrinsic zinc oxide, or i-ZnO, is deposited on the textured upper surface 160 of the glass substrate 152. Preferably, the sputtering process used is a rf-sputtering process with an overlaid DC bias.

EXAMPLE

Substrate 152 is placed in a RF sputtering chamber. The substrate 152 is, for example, a glass plate approximately 26 inches wide by 55 inches long, and approximately 3-10 mm thick. The chamber is approximately 32 inches wide by 60 inches long by 10 inches tall. A target of ZnO of 99.999% or better purity, formed into a rectangular block, is attached to an electrode within the chamber. The chamber wall is grounded, whereas the electrode is coupled to an RF generator.

The chamber then is substantially evacuated. An inert gas, preferably argon, is introduced to bring the pressure in the chamber up to approximately 0.01-0.03 millibars. The entire chamber is heated to approximately 200° C.

Radio-frequency waves are then generated by the RF generator, and applied to the back surface of the target electrode. The radio-frequency waves are of a power density of approximately 300 watts per five inch-square, and preferably of a frequency of 13.56 MHz or integral multiples thereof that may be selected from a broad spectrum of frequencies.

Under these conditions, the argon gas is converted into a plasma state. A DC-bias of approximately negative 3 volts is applied to the electrode. This strongly attracts and accelerates the positively charged argon nuclei. The argon nuclei are accelerated towards the electrode, and impact the surface of the ZnO target. This impact knocks loose individual ZnO molecules which are deposited onto the glass plate 152 to form a thin film.

By this process, the iZnO layer 154 grows at approximately 1-5 angstroms per second. The desired thickness is 500 nm-750 nm (5000 angstroms-7500 angstroms). Layer 154 may be thicker or thinner than this range, as desired.

As they deposit upon the surface, the ZnO molecules naturally form hexagonal crystals, perpendicular to the upper surface 160 of the substrate 152. This regular structure is known as a "fiber texture". Generally, a fiber texture exists when a crystallographic axis is aligned along some preferred direction of a crystalline aggregate.

Surface Etching

For improved light-trapping characteristics, it is greatly desired to etch the top surface 162 of the iZnO layer. To etch the surface 162, known processes such as etching by dipping the surface in a bath can be used. Etching produces a regularly-textured surface with facets with sizes in the range of 2 to 300 microns.

Alternatively, the layer 162 can be etched while it grows during the sputtering process. This has a number of advantages. One major advantage is that it will achieve the same textured result as an acid bath but in less time, by eliminating a specific step dedicated to etching. This eliminates not just the time of the acid etching itself, but all of the time and energy associated with removing the device 150 from the sputtering chamber, performing the acid etch, placing the device into the same or a different sputtering chamber for the next step, and recreating a high vacuum.

Another advantage is that exposing the iZnO layer 154 to an etching agent, as is done in the prior art acid bath, leaves an inherently dirty surface; residual chemicals from the etching agent will remain behind, requiring an additional cleaning process. By eliminating the post-growth etching step and its etching agent, there will be less chemical residue to remove.

To simultaneously grow and etch the iZnO layer, a small modification is made in the sputtering step. Instead of inserting only an inert gas such as Argon into the sputtering chamber, a small amount of water vapor also is injected periodically.

The water vapor initially exists as molecules of $H_2O$ in a gaseous state. However, when exposed to the conditions within the sputtering chamber, it disassociates into ions of $H^+$ and $OH^-$. When the $OH^-$ ions impact upon the growing layer 154, they react with the ZnO to form water, oxygen, and pure zinc, which are released into the chamber atmosphere and vented by the vacuum pump.

Since the $OH^-$ ions are reacting with the zinc oxide, rather than acting merely as a catalyst for another process, the water should be replaced. This is accomplished simply by adding more water vapor into the sputtering chamber from time to time throughout the process. In this way, the ZnO layer is continually etched while it grows, and ends up with an etched surface 305 that has much less residue than that produced by an acid bath.

Layer of Doped Zinc Oxide

Referring again to FIG. 13, on top of surface 162, a thin layer 156 of ZnO lightly doped with an impurity is deposited by sputtering. The impurity used, as stated above, preferably is aluminum, but may be gallium, indium, or boron. This layer 154 is known as conductive zinc oxide or "c-ZnO". Layer 154 preferably is approximately 250 nm thick and is from one half to one-third the thickness of the iZnO layer.

Figure 14:
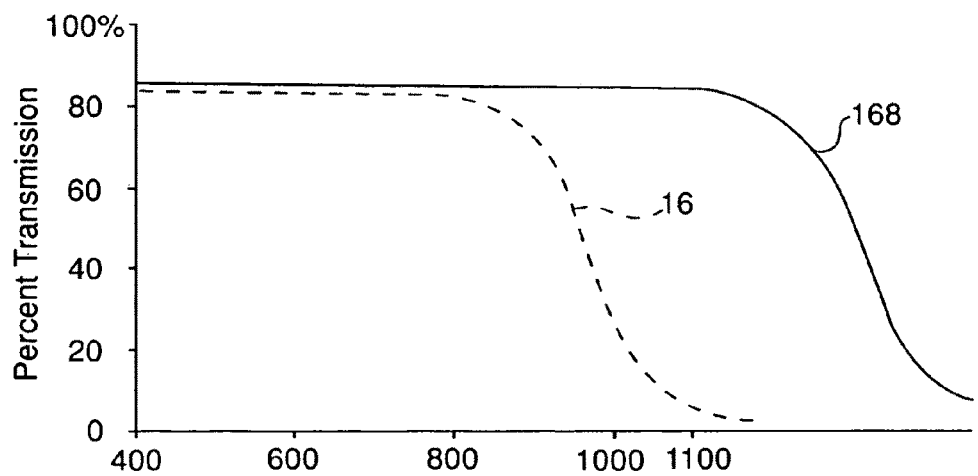
FIG. 14 is a graph showing a comparison of characteristic features of various layers of the device shown in FIG. 13.

Prior art techniques usually provide for the c-ZnO to be doped at roughly 2-5% by weight with impurities. In the present invention, the rate is approximately 1.5%. By thus only lightly doping the zinc oxide, the c-ZnO transmits light of longer wavelengths more readily than does 2-5% doped zinc oxide, as shown in FIG. 14, while retaining the desired conductive characteristics of 2-5% doped zinc oxide.

To control the percent of doping, one of multiple methods may be used.

Preferably, the target will be a substance containing zinc and aluminum in the exact ratio desired. In this way, as is known in the art, the layer being deposited will have the constituents in the same ratio as the target.

Alternatively, the target may be of pure zinc, as was the target used to sputter the i-ZnO layer. A gas containing the doping agent is injected into the sputtering chamber during the sputtering process. By known mechanisms, the doping agent will be incorporated into the new layer being formed. This has the advantage of enabling a change of the doping ratio for subsequent operations in a single chamber without having to mechanically change the target. Furthermore, it also is possible to change the percentage of doping agent at different times throughout the growth of the layer 156.

FIG. 14 shows the light transmission characteristics of 2-5% doped zinc oxide by dashed-line curve 164. As it is shown there, for light of wavelengths up to approximately 800 nm, 2-5% doped zinc oxide transmits approximately 85% of the light. However, as the wavelengths increase beyond 800 nm, the 2-5% doped zinc oxide attenuates the light significantly.

In contrast, the curve 168 shows the light transmission characteristics of lightly-doped (1.5%) zinc oxide. For wavelengths less than approximately 800 nm, the transmission curve is substantially identical to that for 2-5% doped zinc oxide. However, lightly-doped zinc oxide continues to transmit a large percentage of light at wavelengths in the 800-1100 nm region. It is only for light of wavelengths greater than approximately 1100 nm that lightly doped zinc oxide begins to attenuate significant portions of the light.

Perforated Transparent Conductive Layer

In accordance with another feature of the invention, section 165 of the conducting layer 156 is made thinner or in spots removed entirely, forming holes or pits extending through or partially through layer 156. These holes are believed to allow the transmission of more light without significantly reducing the electrical current-carrying capacity of the layer 156. Preferably, the holes 165 will cover roughly 30-50% of the surface area of the layer 156. The net result is believed to be an increase in the current output of the photovoltaic device for a given amount of light received.

Etching can be used to make the holes 165, such as by dipping into an acid bath.

Another process is to simultaneously grow layer 156 while etching with OH⁻ ions from disassociated water vapor during the sputtering process, as described above for simultaneously growing and etching layer 154.

Using either of these etching methods, the location of the resulting holes 165 will be random, and the shape of the holes may be irregular. Generally, the random locations and shapes are acceptable.

The etching process should be controlled so as to not etch away more than 50% of the surface area, and so as not to produce islands of doped ZnO which are isolated from the rest of layer 156.

Alternatively, photolithograph etching, which is known and used in the semiconductor manufacturing art, may be used. This has the advantage of providing exact control over the location of the holes and the ability to ensure that islands are not developed.

Preferably, the simultaneous etching should be used, as it is more controllable than an acid bath, and cheaper and easier than photolithographic etching.

As it has been described above, the layer of pure zinc oxide preferably is between 2 and 3 times as thick as the conductive zinc oxide layer 156.

This structure takes advantage of the fact that the "haze factor" of pure zinc oxide is very similar to that of doped zinc oxide, but pure zinc oxide has a considerably better transmission characteristic, as it is shown in FIG. 14. Thus, by making the majority of the TCLO composite coating of pure zinc oxide, "light trapping" (retaining photons in the active layer 154), which is enhanced by a higher "haze factor" is kept at a high level while improving the current density output of the device.

It is believe that this improvement can produce a current density improvement in any thin-film photovoltaic device. The magnitude of the possible improvement is as much as 30% or more.

Although the invention has thus been shown and described with reference to specific embodiments, it should be noted that the invention is in no way limited to the details of the described arrangements but changes and modifications may be made without departing from the scope of the invention which is defined by the appended claims.

The invention claimed is:

1. A support member transmissive to electromagnetic radiation comprising visible light,
    (a) a first thin-film coating on one surface of said support member, said first coating comprising substantially pure zinc oxide in fiber texture form and having relatively low electrical conductivity, and which is transmissive to electromagnetic radiation comprising visible light, and;
    (b) a second thin-film coating on said first coating, said second coating comprising zinc oxide transmissive to electromagnetic radiation comprising visible light, and doped to make it electrically conductive.

2. The structure of claim 1 wherein the upper surface of said first coating is etched.

3. The structure of Claim 1 wherein said second coating is doped with approximately 1.5% by weight aluminum.

4. The structure of claim 1 wherein said support member is comprised of glass and the thickness of said first coating is at least twice the thickness of said second coating.

5. The structure of claim 4 wherein said glass is selected from the group consisting of low-iron glass and soda lime glass.

6. The structure of Claim 1 wherein said first coating is between approximately 500 nm thick and approximately 750 nm thick.

7. The structure of claim 6 wherein said second coating is approximately 250 nm thick.

8. The structure of Claim 1 further comprising a thin-film coating of silicon dioxide on said one surface of said support member and underneath said first thin-film coating.

9. The structure of claim 8 wherein said aluminum comprises approximately 1.5% by weight of said second layer having a thin-film coating of silicon dioxide on the surface of said support member opposite said one surface.

10. The structure of claim 2 wherein the surface of said second coating is etched.

11. A support member transmissive to electromagnetic radiation comprising visible light,
   (a) a first thin-film coating on one surface of said support member, said first coating comprising substantially pure zinc oxide in fiber texture form and having relatively low electrical conductivity, and which is transmissive to electromagnetic radiation comprising visible light, and;
   (b) a second thin-film coating on said first coating, said second coating comprising zinc oxide transmissive to electromagnetic radiation comprising visible light, and doped to make it electrically conductive,
   wherein said second coating has a plurality of recesses distributed over its surface.

12. The structure of claim 11 wherein said recesses comprise pits and holes, said pits and holes occupying an area of up to approximately 50% of the total area of said second coating.

13. The structure of claim 11 in which said recesses comprise through holes.

14. The structure of claim 1 in which said support member has an etched surface on which said first coating is formed.

15. The structure as in claim 14 in which the size of the surface irregularities is of the same order of magnitude as the wavelengths of light to be transmitted through said structure.

16. A structure as in claim 8 in which said support member has an etched surface on which said silicon dioxide coating is formed.

17. A support member transmissive to electromagnetic radiation comprising visible light,
   (a) a first thin-film coating on one surface of said support member, said first coating comprising substantially pure zinc oxide in fiber texture form and having relatively low electrical conductivity, and which is transmissive to electromagnetic radiation comprising visible light, and;
   (b) a second thin-film coating on said first coating, said second coating comprising zinc oxide transmissive to electromagnetic radiation comprising visible light, and doped to make it electrically conductive.
   (c) said one surface of said support member being roughened,
   (d) a thin-film coating of silicon dioxide on said one surface of said support member and underneath said first coating,
   (e) the upper surface of said first coating being etched and having recesses, and
   (f) said second coating comprising approximately 1.5% by weight of aluminum.

18. A structure as in claim 17 in which there is a second coating of silicon dioxide on the surface of said support member opposite said one surface.

* * * * *